(12) United States Patent
Kudo

(10) Patent No.: US 12,690,208 B2
(45) Date of Patent: Jul. 21, 2026

(54) SEMICONDUCTOR DEVICE

(71) Applicant: Mitsubishi Electric Corporation,
Tokyo (JP)

(72) Inventor: Tomohito Kudo, Tokyo (JP)

(73) Assignee: Mitsubishi Electric Corporation,
Tokyo (JP)

( * ) Notice: Subject to any disclaimer, the term of this
patent is extended or adjusted under 35
U.S.C. 154(b) by 295 days.

(21) Appl. No.: 18/040,953

(22) PCT Filed: Feb. 9, 2021

(86) PCT No.: PCT/JP2021/004782
§ 371 (c)(1),
(2) Date: Feb. 7, 2023

(87) PCT Pub. No.: WO2022/172328
PCT Pub. Date: Aug. 18, 2022

(65) Prior Publication Data
US 2023/0268429 A1 Aug. 24, 2023

(51) Int. Cl.
*H10D 12/00* (2025.01)
*H10D 62/13* (2025.01)
(52) U.S. Cl.
CPC ......... *H10D 12/411* (2025.01); *H10D 62/137*
(2025.01)
(58) Field of Classification Search
CPC .. H10D 12/031; H10D 12/032; H10D 12/037;
H10D 12/411; H10D 12/461;
(Continued)

(56) References Cited

U.S. PATENT DOCUMENTS

| | | | | |
|---|---|---|---|---|
| 5,631,494 A | * | 5/1997 | Sakurai | H03K 17/0828 |
| | | | | 257/E29.198 |
| 5,828,100 A | * | 10/1998 | Tamba | H10D 62/393 |
| | | | | 257/334 |
| 5,883,402 A | * | 3/1999 | Omura | H10D 89/60 |
| | | | | 257/487 |
| 8,039,879 B2 | * | 10/2011 | Ueno | H01L 29/0619 |
| | | | | 257/E29.198 |
| 2009/0057832 A1 | | 3/2009 | Kouno | |

(Continued)

FOREIGN PATENT DOCUMENTS

| | | | | |
|---|---|---|---|---|
| CA | 2735527 A1 | * | 10/2011 | H03K 17/082 |
| JP | H08-64816 A | | 3/1996 | |

(Continued)

OTHER PUBLICATIONS

An Office Action; "Notice of Reasons for Refusal," mailed by the
Japanese Patent Office on Feb. 20, 2024, which corresponds to
Japanese Patent Application No. 2022-581050 and is related to U.S.
Appl. No. 18/040,953; with English language translation.

(Continued)

*Primary Examiner* — Natalia A Gondarenko
(74) *Attorney, Agent, or Firm* — Studebaker Brackett
PLLC

(57) ABSTRACT

A semiconductor substrate (1) includes a main region (2)
and a sense region (3) having a smaller operation region area
than that of the main region (2). An IGBT is formed in the
main region (2). A MOSFET is formed as a sense device in
the sense region (3) and has a gate electrode (15) connected
to a gate electrode (15) of the IGBT. A front surface
electrode (5) is formed on a front surface of the semicon-
ductor substrate (1) in the main region (2). A rear surface
electrode (20) is formed on a rear surface of the semicon-
ductor substrate (1) in the main region (2) and the sense
region (3). A current detection electrode (6) is formed on the
front surface in the sense region (3) and separated from the
front surface electrode (5).

14 Claims, 3 Drawing Sheets

(58) Field of Classification Search
CPC .... H10D 12/441; H10D 62/137; H10D 62/40;
H10D 62/605; H10D 62/141; H10D
62/145; H10D 62/149; H10D 64/232;
H10D 64/251; H10D 64/252; H10D
64/518; H10D 84/0105; H10D 84/0107;
H10D 84/0109; H10D 84/0123; H10D
84/0126; H10D 84/0133; H10D 84/101;
H10D 84/138; H10D 84/161; H10D
84/201; H10D 84/204; H10D 84/221;
H10D 30/0245; H10D 30/831; H10D
8/045; H10D 8/411; H10D 8/422; H10D
12/481; H10D 30/66–668; H10D 30/669;
H10D 64/117; H10D 64/231; H10D
64/511; H10D 64/512; H10D 64/513;
H10D 62/113; H10D 62/115; H10D
62/142; H10D 62/292; H10D 62/8325;
H10D 62/8503; H10D 84/0121; H10D
84/0195; H10D 84/143; H10D 84/144;
H10D 84/40; H10D 84/401; H02K 15/40;
H10F 30/283
USPC ......... 257/288, 48, 273, 394, 551, 265, 378,
257/577, 572, 566, 139
See application file for complete search history.

(56)     References Cited

U.S. PATENT DOCUMENTS

2014/0184303 A1*  7/2014  Hasegawa ......... H01L 23/49562
                                                              327/377
2015/0014687 A1*  1/2015  Nakajima .............. H10D 89/10
                                                              257/48
2016/0247808 A1   8/2016  Horiuchi et al.

FOREIGN PATENT DOCUMENTS

| JP | 2009-099690 A | 5/2009 |
|----|---------------|--------|
| JP | 2012-156564 A | 8/2012 |
| JP | 2015-164159 A | 9/2015 |
| JP | 6652173 B2 | 2/2020 |
| JP | 2020-170827 A | 10/2020 |

OTHER PUBLICATIONS

An Office Action mailed by the German Patent Office on Feb. 27, 2024, which corresponds to German Patent Application No. 112021007052.5 and is related to U.S. Appl. No. 18/040,953; with English language translation.
International Search Report issued in PCT/JP2021/004782; mailed Apr. 27, 2021.

* cited by examiner

SEMICONDUCTOR DEVICE

FIELD

The present disclosure relates to a semiconductor device.

BACKGROUND

A semiconductor device such as a reverse conducting IGBT (RC-IGBT) has been used as an inverter device. The RC-IGBT generally used includes a main region and a sense region having a smaller operation region area than that of the main region (see, e.g., PTL 1). A current and a voltage in the main region are monitored by a sense device formed in the sense region, to detect whether or not an abnormality has occurred in the main region.

CITATION LIST

Patent Literature

[PTL 1] JP 2009-99690 A

SUMMARY

Technical Problem

In a conventional RC-IGBT, a p-type collector layer has been formed on a rear surface of a substrate in a sense region. In a low current region, a current cannot exceed a built-in voltage at which a back pn junction including a p-type collector layer and an n-type drift layer is turned on, whereby an on-voltage increases. The moment the current increases to exceed the built-in voltage, holes are injected from the p-type collector layer, resulting in conductivity modulation. Therefore, there occurs snapback in which the on-voltage rapidly decreases. Accordingly, there has been a problem that control is difficult.

The present disclosure has been made to solve the above-described problem, and is directed to obtaining a semiconductor device capable of preventing snapback to improve a detection sensitivity.

Solution to Problem

A semiconductor device according to the present disclosure includes: a semiconductor substrate including a main region and a sense region having a smaller operation region area than that of the main region; an IGBT formed in the main region; a MOSFET formed as a sense device in the sense region and having a gate electrode connected to a gate electrode of the IGBT; a front surface electrode formed on a front surface of the semiconductor substrate in the main region; a rear surface electrode formed on a rear surface of the semiconductor substrate in the main region and the sense region; and a current detection electrode formed on the front surface in the sense region and separated from the front surface electrode.

Advantageous Effects of Invention

In the present disclosure, a pn junction does not exist on the rear surface of the substrate in the sense region. Accordingly, snapback due to conductivity modulation does not occur. Further, the IGBT is formed in the main region, and the MOSFET is formed in the sense region. Accordingly, in a low current region, the sense region has a lower on-voltage. Therefore, responsiveness at a turn-on time in the low current region is increased so that the detection sensitivity of the sense device can be improved.

DESCRIPTION OF EMBODIMENTS

A semiconductor device according to the embodiments of the present disclosure will be described with reference to the drawings. The same components will be denoted by the same symbols, and the repeated description thereof may be omitted.

Embodiment 1

Figure 1:
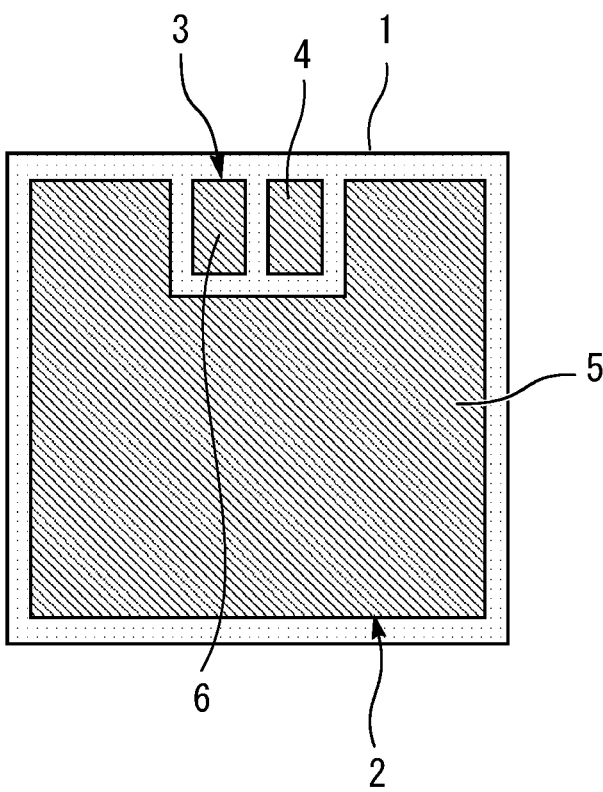
FIG. 1 is a plan view illustrating a semiconductor device according to an embodiment 1.

FIG. 1 is a plan view illustrating a semiconductor device according to an embodiment 1. A semiconductor substrate 1 includes a main region 2 and a sense region 3 having a smaller operation region area than that of the main region 2. A gate pad 4, a front surface electrode 5, and a current detection electrode 6 are formed on a front surface of the semiconductor substrate 1. The front surface electrode 5 is formed in the main region 2. The current detection electrode 6 is formed in the sense region 3, and is separated from the front surface electrode 5.

Figure 2:
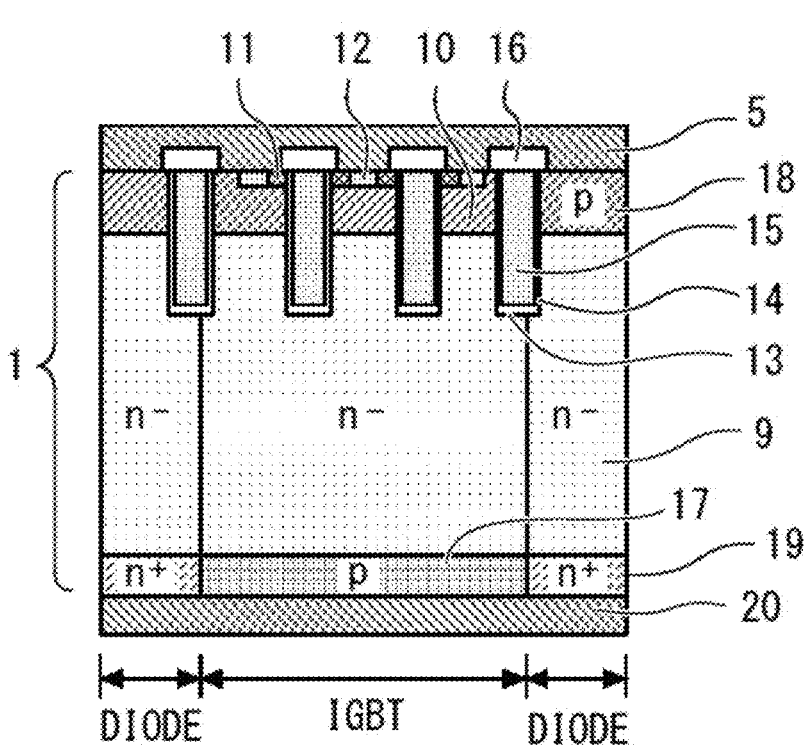
FIG. 2 is a cross-sectional view illustrating the main region in the semiconductor device according to the embodiment 1.

FIG. 2 is a cross-sectional view illustrating the main region in the semiconductor device according to the embodiment 1. An IGBT and a diode are formed in the main region 2. Therefore, the semiconductor device according to the present embodiment is an RC-IGBT.

In the IGBT, a p-type base layer 10 is formed on an n⁻-type drift layer 9 in the semiconductor substrate 1. An n⁺-type emitter layer 11 and a p⁺-type diffusion layer 12 are formed on a front surface layer of the p-type base layer 10. A trench 13 that penetrates the n⁺-type emitter layer 11 and the p-type base layer 10 is formed on the front surface side of the semiconductor substrate 1. A gate electrode 15 made of polysilicon or the like is formed in the trench 13 with a gate oxide film 14 interposed therebetween. An interlayer insulating film 16 is formed on the gate electrode 15. A p-type collector layer 17 is formed under the n⁻-type drift layer 9.

In the diode, a p-type anode layer 18 is formed on an n⁻-type drift layer 9. An n⁺-type cathode layer 19 is formed under the n⁻-type drift layer 9.

The front surface electrode 5 is connected to the p-type base layer 10, the n⁺-type emitter layer 11, the p⁺-type diffusion layer 12, and the p-type anode layer 18. A rear surface electrode 20 is formed on a rear surface of the semiconductor substrate 1 in the main region 2 and the sense region 3, and is connected to the p-type collector layer 17 and the n⁺-type cathode layer 19.

Figure 3:
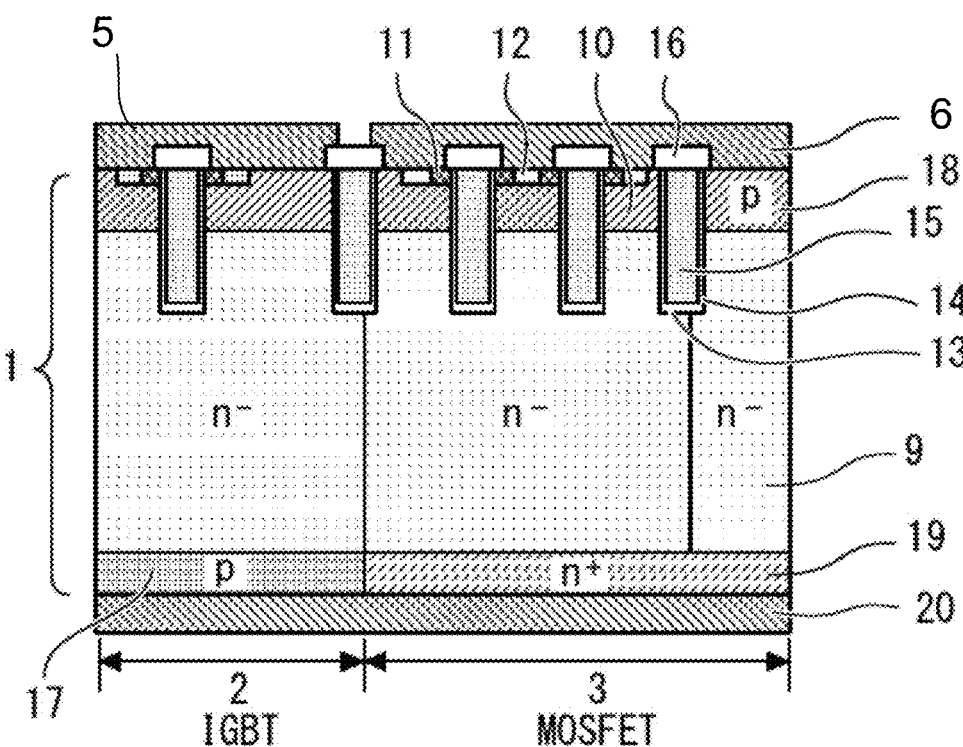
FIG. 3 is a cross-sectional view illustrating the sense region in the semiconductor device according to the embodiment 1.

FIG. 3 is a cross-sectional view illustrating the sense region in the semiconductor device according to the embodiment 1. A MOSFET is formed as a sense device in the sense region 3. The MOSFET has a structure in which the p-type collector layer 17 of the IGBT in the main region 2 is replaced with an n⁺-type cathode layer 19. That is, although the IGBT has the p-type collector layer 17 on the rear surface side of the semiconductor substrate 1, the MOSFET does not have a p-type collector layer 17 on the rear surface side of the semiconductor substrate 1. Therefore, the p-type collector layer 17 is not formed on the rear surface side of the semiconductor substrate 1 in the sense region 3. The MOSFET has an n⁺-type emitter layer 11 and the n⁺-type cathode layer 19, respectively, as its source and drain.

A gate electrode 15 of the MOSFET is connected to the gate electrode 15 of the IGBT. The current detection electrode 6 is connected to a p-type base layer 10, the n⁺-type emitter layer 11, and a p⁺-type diffusion layer 12 of the MOSFET. The rear surface electrode 20 is connected to the n⁺-type cathode layer 19 of the MOSFET.

In the present embodiment, a pn junction does not exist on the rear surface of the substrate in the sense region 3. Accordingly, snapback due to conductivity modulation does not occur. Further, the IGBT is formed in the main region, and the MOSFET is formed in the sense region. Accordingly, in a low current region, the sense region has a lower on-voltage. Therefore, responsiveness at a turn-on time in the low current region is increased so that the detection sensitivity of the sense device can be improved.

Further, conventionally, snapback has more easily occurred in an RC-IGBT in which an n-type cathode layer is formed on a rear surface of a substrate in a main region. Therefore, a configuration according to the present disclosure is particularly effective in an RC-IGBT, although also applicable to an IGBT including no diode. Further, when the RC-IGBT is produced, an n-type cathode layer is generally formed using a photolithographic technique after a p-type collector layer is formed on an entire rear surface. When an n-type cathode layer of a diode in a main region is formed, an n-type layer of a MOSFET in a sense region is formed. This makes it possible to form a structure according to the present embodiment without adding a manufacturing process.

A cross-sectional view disclosed in the present embodiment is merely an example, and the present disclosure is not limited to the illustrated structure. Although a diode having a dummy trench is illustrated, for example, a diode having no dummy trench may be used.

Embodiment 2

Figures 4, 5:
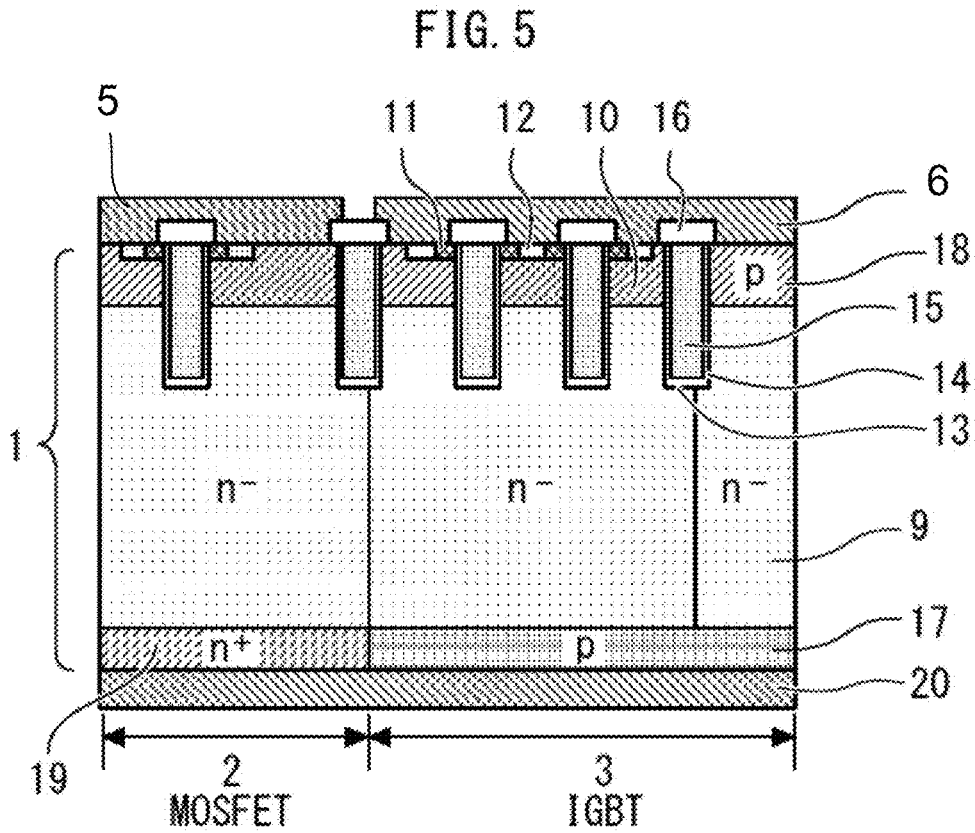
FIG. 4 is a cross-sectional view illustrating a main region in a semiconductor device according to an embodiment 2.
FIG. 5 is a cross-sectional view illustrating the sense region in the semiconductor device according to the embodiment 2.

FIG. 4 is a cross-sectional view illustrating a main region in a semiconductor device according to an embodiment 2. A semiconductor substrate 1 includes a main region 2 and a sense region 3 having a smaller operation region area than that of the main region 2, like in the embodiment 1.

A MOSFET is formed in the main region 2. The MOSFET has a structure in which the p-type collector layer 17 of the IGBT in the main region 2 in the embodiment 1 is replaced with an n⁺-type cathode layer 19. A front surface electrode 5 is connected to a p-type base layer 10, an n⁺-type emitter layer 11, and a p⁺-type diffusion layer 12 of the MOSFET. A rear surface electrode 20 is connected to the n⁺-type cathode layer 19 of the MOSFET.

FIG. 5 is a cross-sectional view illustrating the sense region in the semiconductor device according to the embodiment 2. An IGBT is formed as a sense device in the sense region 3. This IGBT has a similar structure to that of the IGBT in the main region 2 in the embodiment 1. A gate electrode 15 of the IGBT in the sense region 3 is connected to a gate electrode 15 of the MOSFET in the main region 2. A current detection electrode 6 is connected to a p-type base layer 10, an n⁺-type emitter layer 11, and a p⁺-type diffusion layer 12 of the IGBT. The current detection electrode 6 is formed in the sense region 3, and is separated from the front surface electrode 5. A rear surface electrode 20 is connected to a p-type collector layer 17 of the IGBT.

In the present embodiment, the MOSFET is formed in the main region, and the IGBT is formed in the sense region. Accordingly, in a high current region, the sense region has a lower on-voltage. Therefore, responsiveness at a turn-on time in the high current region is increased so that the detection sensitivity of the sense device can be improved.

The semiconductor substrate 1 is not limited to a substrate formed of silicon, but instead may be formed of a wide-bandgap semiconductor having a bandgap wider than that of silicon. The wide-bandgap semiconductor is, for example, a silicon carbide, a gallium-nitride-based material, or diamond. A semiconductor device formed of such a wide-bandgap semiconductor has a high voltage resistance and a high allowable current density, and thus can be miniaturized. The use of such a miniaturized semiconductor device enables the miniaturization and high integration of the semiconductor module in which the semiconductor device is incorporated. Further, since the semiconductor device has a high heat resistance, a radiation fin of a heatsink can be miniaturized and a water-cooled part can be air-cooled, which leads to further miniaturization of the semiconductor module. Further, since the semiconductor device has a low power loss and a high efficiency, a highly efficient semiconductor module can be achieved.

REFERENCE SIGNS LIST 1 semiconductor substrate; 2 main region; 3 sense region; 5 front surface electrode; 6 current detection electrode; 15 gate electrode; 17 p-type collector layer; 20 rear surface electrode

The invention claimed is:

1. A semiconductor device comprising:
a semiconductor substrate including a main region and a sense region having a smaller operation region area than that of the main region;
an IGBT formed in the main region;
a MOSFET formed as a sense device in the sense region and having a gate electrode connected to a gate electrode of the IGBT;
a front surface electrode formed on a front surface of the semiconductor substrate in the main region;
a rear surface electrode formed on a rear surface of the semiconductor substrate in the main region and the sense region such that the rear surface electrode electrically contacts a collector layer of the IGBT and a drain layer of the MOSFET; and
a current detection electrode formed on the front surface in the sense region and separated from the front surface electrode, wherein
a trench is positioned in the semiconductor substrate between the IGBT and the MOSFET, the trench being spaced from all source layers of the MOSFET and all emitter layers of the IGBT,
the MOSFET and the IGBT each comprise a first layer of a same conductivity type as the collector layer, and the MOSFET and the IGBT each comprise a second layer of the same conductivity type as the collector layer, the second layer having a higher impurity concentration than that of the first layer, and the trench is spaced from the second layer of the MOSFET and the IGBT.

2. The semiconductor device according to claim 1, further comprising a diode formed in the main region.

3. A semiconductor device comprising:

a semiconductor substrate including a main region and a sense region having a smaller operation region area than that of the main region;

a MOSFET formed in the main region;

an IGBT formed as a sense device in the sense region and having a gate electrode connected to a gate electrode of the MOSFET;

a front surface electrode formed on a front surface of the semiconductor substrate in the main region;

a rear surface electrode formed on a rear surface of the semiconductor substrate in the main region and the sense region such that the rear surface electrode electrically contacts a drain layer of the MOSFET and a collector layer of the IGBT; and a current detection electrode formed on the front surface in the sense region and separated from the front surface electrode, wherein a trench is positioned in the semiconductor substrate between the IGBT and the MOSFET, the trench being spaced from all source layers of the MOSFET and all emitter layers of the IGBT, the MOSFET and the IGBT each comprise a first layer of a same conductivity type as the collector layer, and the MOSFET and the IGBT each comprise a second layer of the same conductivity type as the collector layer, the second layer having a higher impurity concentration than that of the first layer, and the trench is spaced from the second layer of the MOSFET and the IGBT.

4. The semiconductor device according to claim 1, wherein the IGBT has the p-type collector layer on the rear surface side of the semiconductor substrate, and the MOSFET does not have a p-type collector layer on the rear surface side of the semiconductor substrate.

5. The semiconductor device according to claim 1, wherein the semiconductor substrate is formed of a wide-bandgap semiconductor.

6. The semiconductor device according to claim 2, wherein the IGBT has the p-type collector layer on the rear surface side of the semiconductor substrate, and the MOSFET does not have a p-type collector layer on the rear surface side of the semiconductor substrate.

7. The semiconductor device according to claim 3, wherein the IGBT has the p-type collector layer on the rear surface side of the semiconductor substrate, and the MOSFET does not have a p-type collector layer on the rear surface side of the semiconductor substrate.

8. The semiconductor device according to claim 2, wherein the semiconductor substrate is formed of a wide-bandgap semiconductor.

9. The semiconductor device according to claim 3, wherein the semiconductor substrate is formed of a wide-bandgap semiconductor.

10. The semiconductor device according to claim 4, wherein the semiconductor substrate is formed of a wide-bandgap semiconductor.

11. The semiconductor device according to claim 6, wherein the semiconductor substrate is formed of a wide-bandgap semiconductor.

12. The semiconductor device according to claim 7, wherein the semiconductor substrate is formed of a wide-bandgap semiconductor.

13. The semiconductor device according to claim 1, wherein the rear surface electrode directly electrically contacts the collector layer of the IGBT and the drain layer of the MOSFET, the collector layer of the IGBT and the drain layer of the MOSFET having different conductivity types.

14. The semiconductor device according to claim 3, wherein the rear surface electrode directly electrically contacts the collector layer of the IGBT and the drain layer of the MOSFET, the collector layer of the IGBT and the drain layer of the MOSFET having different conductivity types.

* * * * *